United States Patent [19]

Billman et al.

[11] Patent Number: 4,718,855

[45] Date of Patent: * Jan. 12, 1988

[54] SOCKET FOR INTEGRATED CIRCUIT COMPONENT

[75] Inventors: Timothy B. Billman, King; James R. Coller, Kernersville; Gary R. Marpoe, Jr., Winston-Salem, all of N.C.

[73] Assignee: AMP Incorporated, Harrisburg, Pa.

[*] Notice: The portion of the term of this patent subsequent to Dec. 24, 2002 has been disclaimed.

[21] Appl. No.: 793,516

[22] Filed: Oct. 31, 1985

Related U.S. Application Data

[63] Continuation-in-part of Ser. No. 677,154, Dec. 3, 1984, Pat. No. 4,560,218.

[51] Int. Cl.⁴ .............................................. H01R 23/72
[52] U.S. Cl. ...................................................... 439/70
[58] Field of Search ......... 339/17 CF, 17 LC, 17 LM, 339/17 C, 174, 176 M, 176 MP, 192 R; 439/68–73, 525, 682

[56] References Cited

U.S. PATENT DOCUMENTS

| | | | |
|---|---|---|---|
| 3,212,047 | 10/1965 | McDonough | 339/17 CF |
| 3,391,383 | 7/1968 | Antes | 339/17 CF |
| 3,737,838 | 6/1973 | Mattingly, Jr. et al. | 339/176 MP |
| 4,033,656 | 7/1977 | Freehauf et al. | 339/17 CF |
| 4,420,205 | 12/1983 | Kirkman | 339/74 R |
| 4,560,218 | 12/1985 | Billman et al. | 339/192 R |

FOREIGN PATENT DOCUMENTS 2323231 4/1977 France .
2092837 8/1982 United Kingdom ........... 339/17 CF

OTHER PUBLICATIONS

IBM Bulletin, McConnell, vol. 3, No. 12, p. 11, 5-1961.

Primary Examiner—Neil Abrams
Attorney, Agent, or Firm—Robert W. Pitts

[57] ABSTRACT

Sockets specifically adapted for burn-in testing of small outline integrated circuit components are disclosed. The multicontact sockets have terminals located in cavities oriented to receive the small outline integrated circuit leads. The terminals are located between adjacent leads and are positioned to resiliently engage the interstitial edges of the package leads, thus imparting minimal stress normal to the plane of the leads. Both surface mount and through-hole sockets are disclosed and the terminals as depicted can have a bowed leaf spring configuration or a preloaded flat terminal, arcuately deformed for retention within the housing cavities. Thus the small outline integrated circuit components can be routinely inserted into the sockets for test purposes. The sockets can also be used in a conventional manner to socket integrated circuit components such as SOICs on a printed circuit board.

23 Claims, 15 Drawing Figures

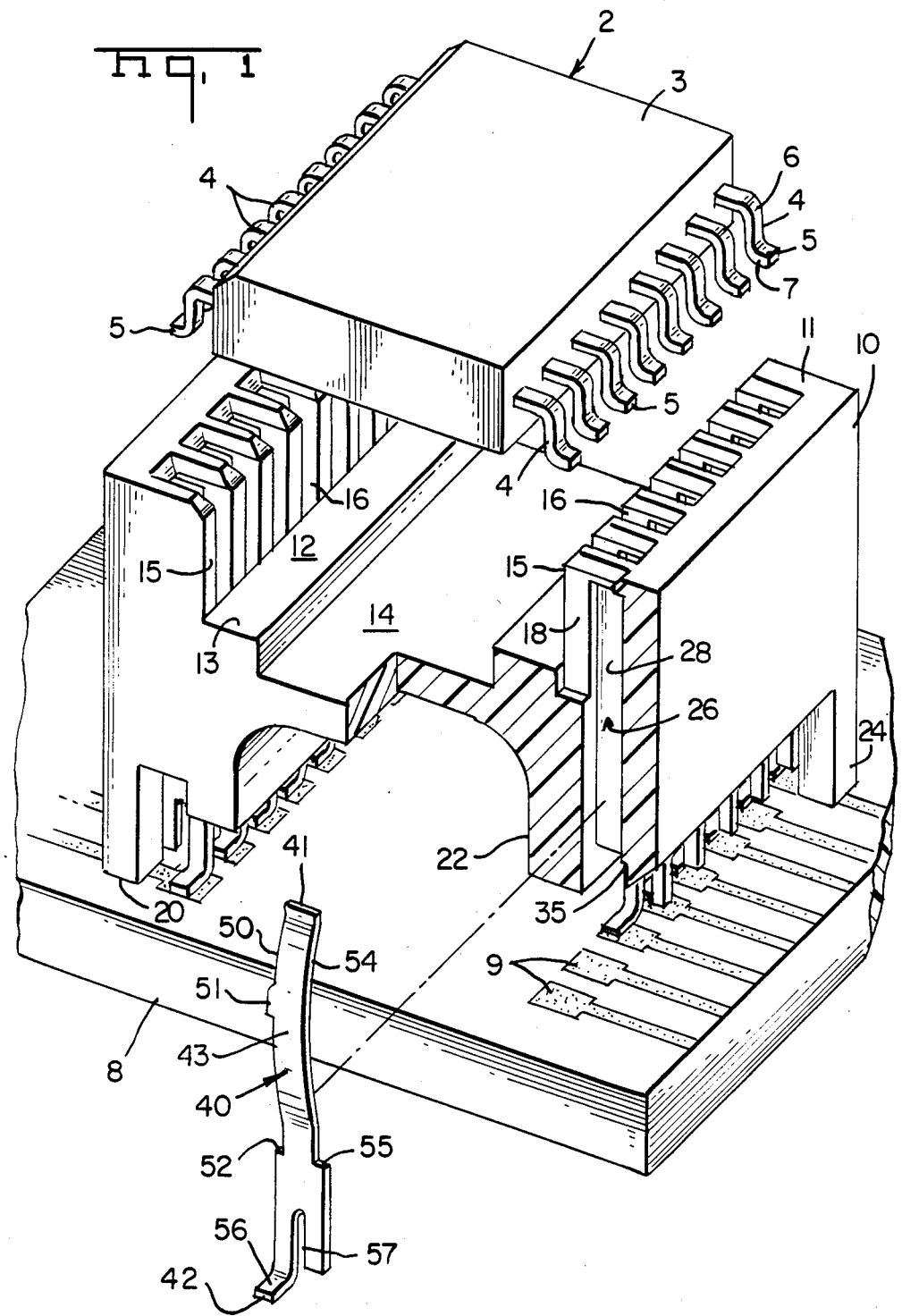

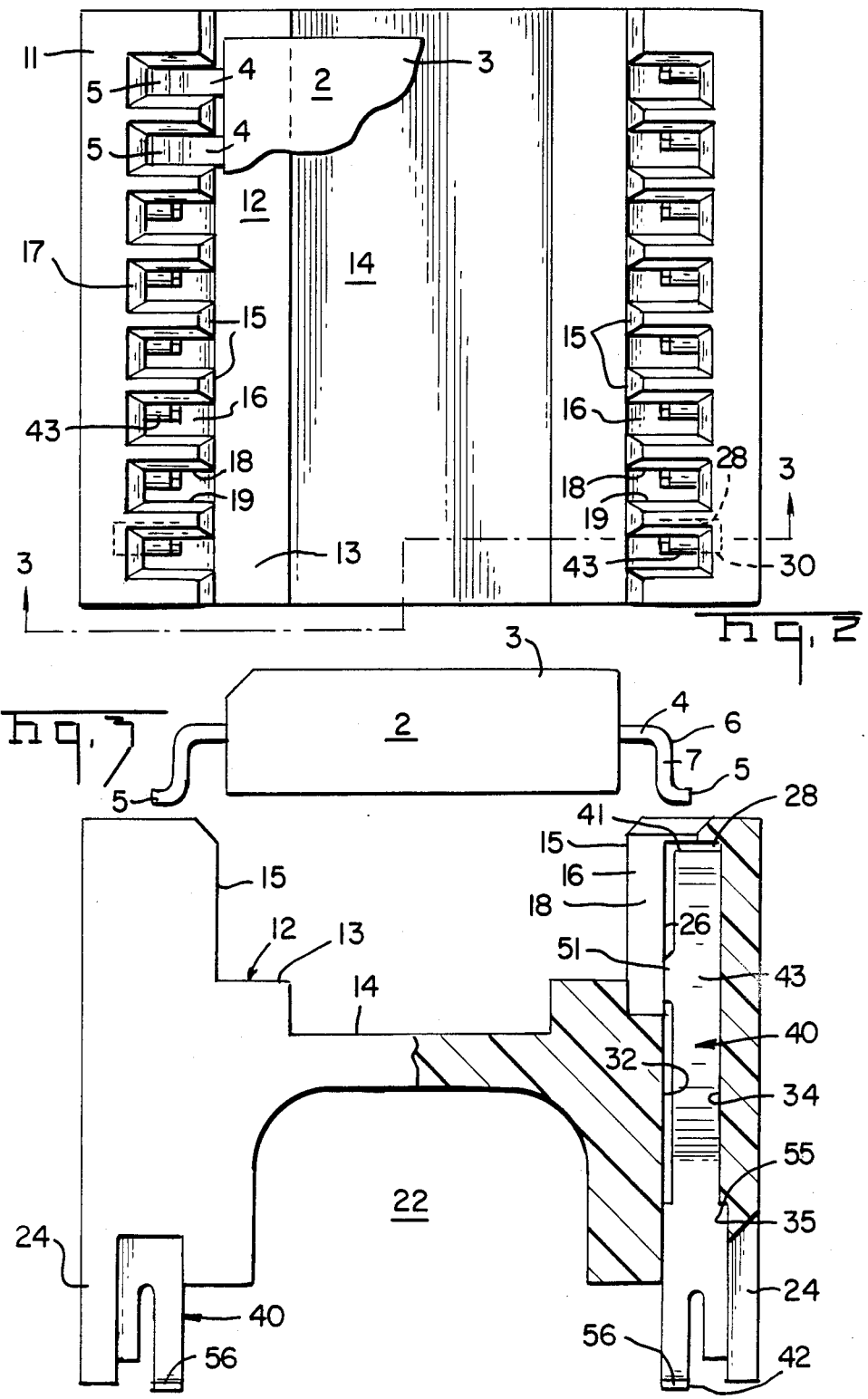

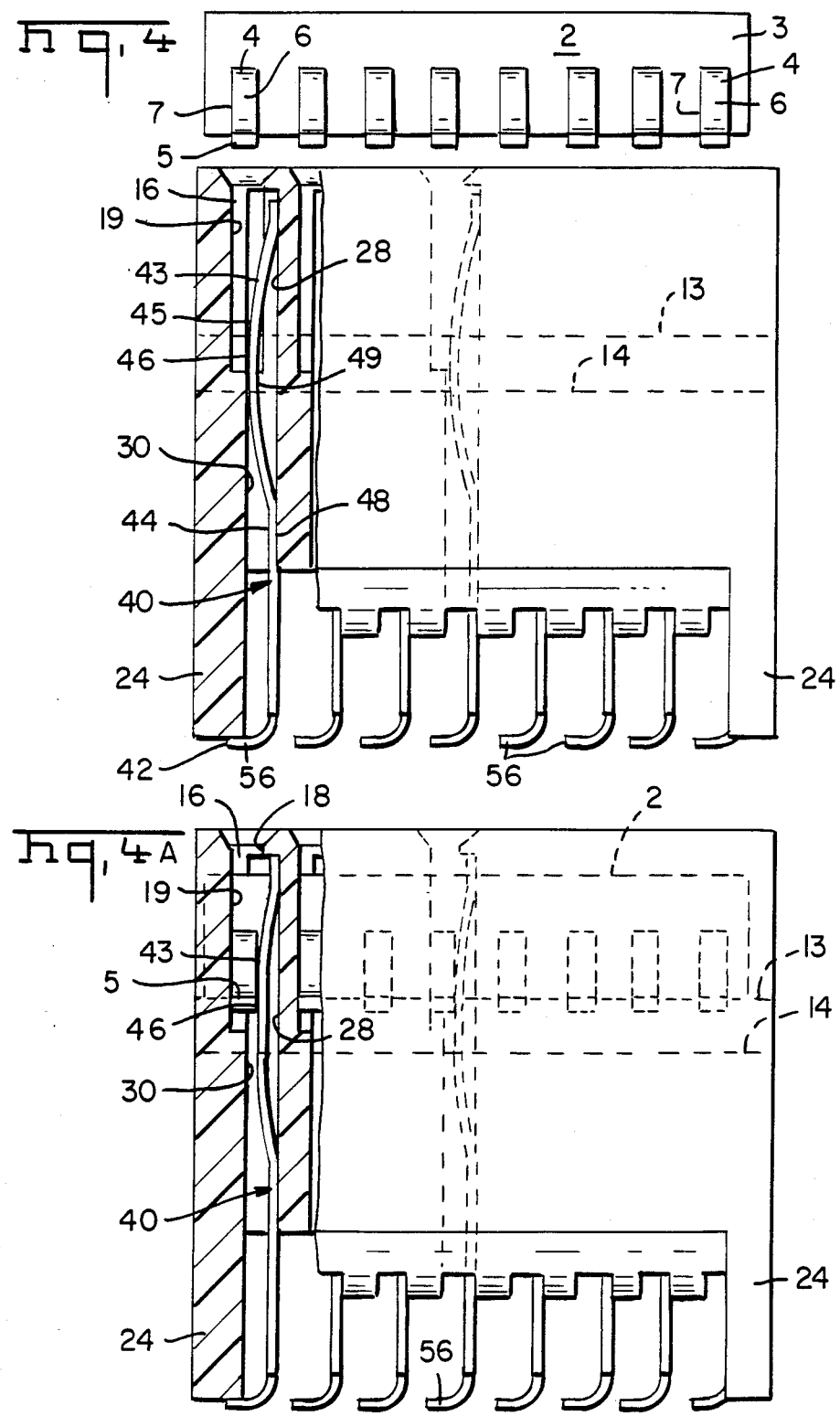

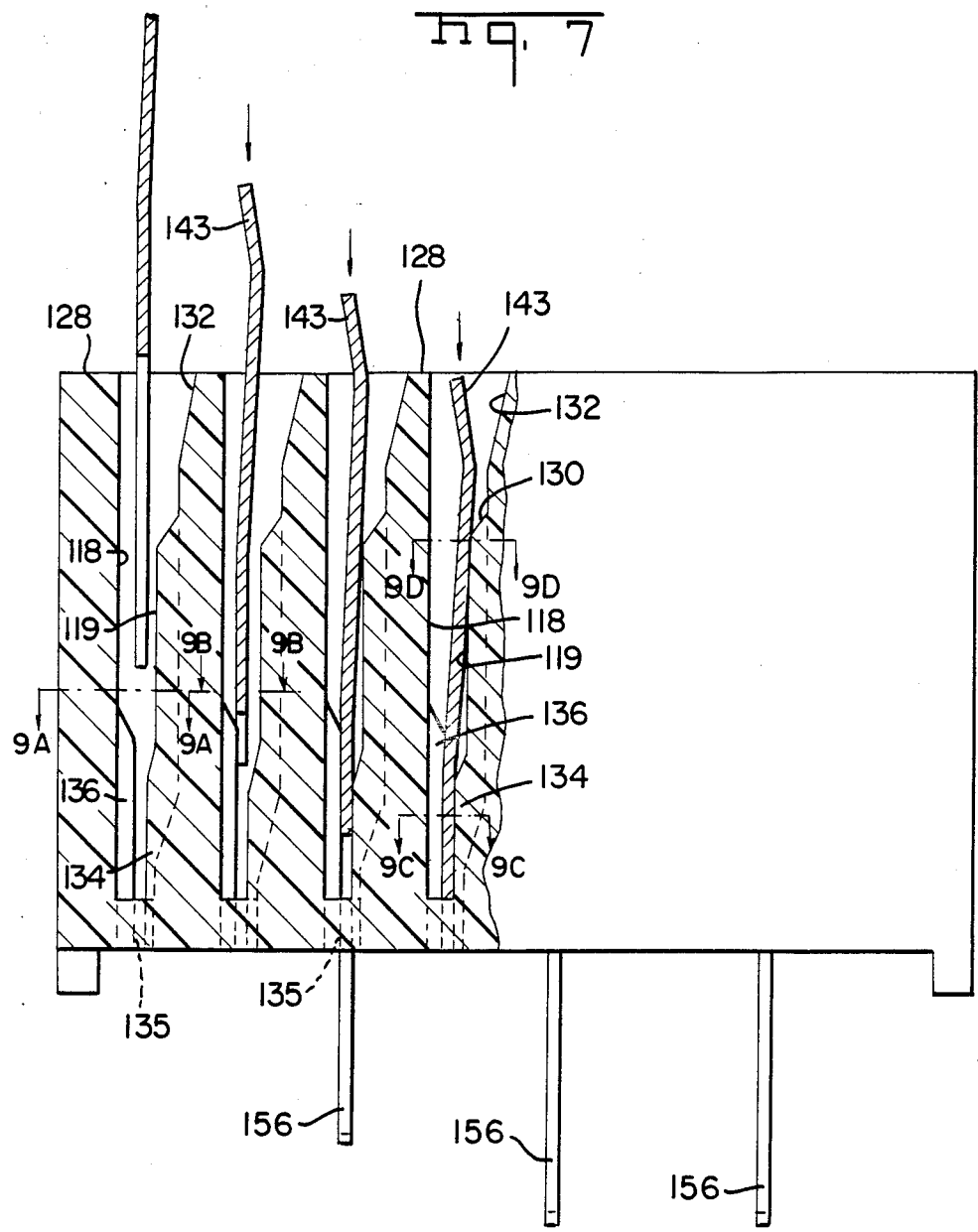

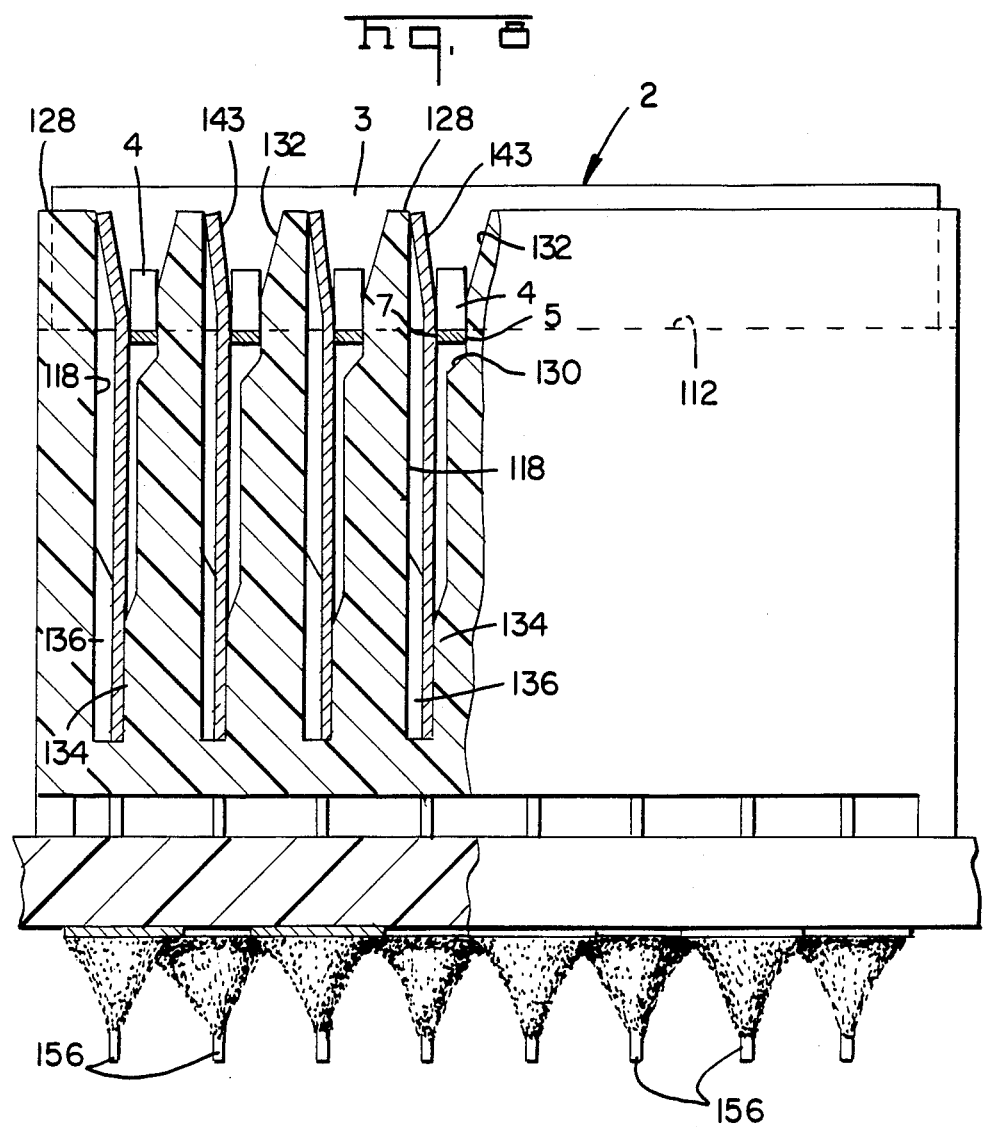

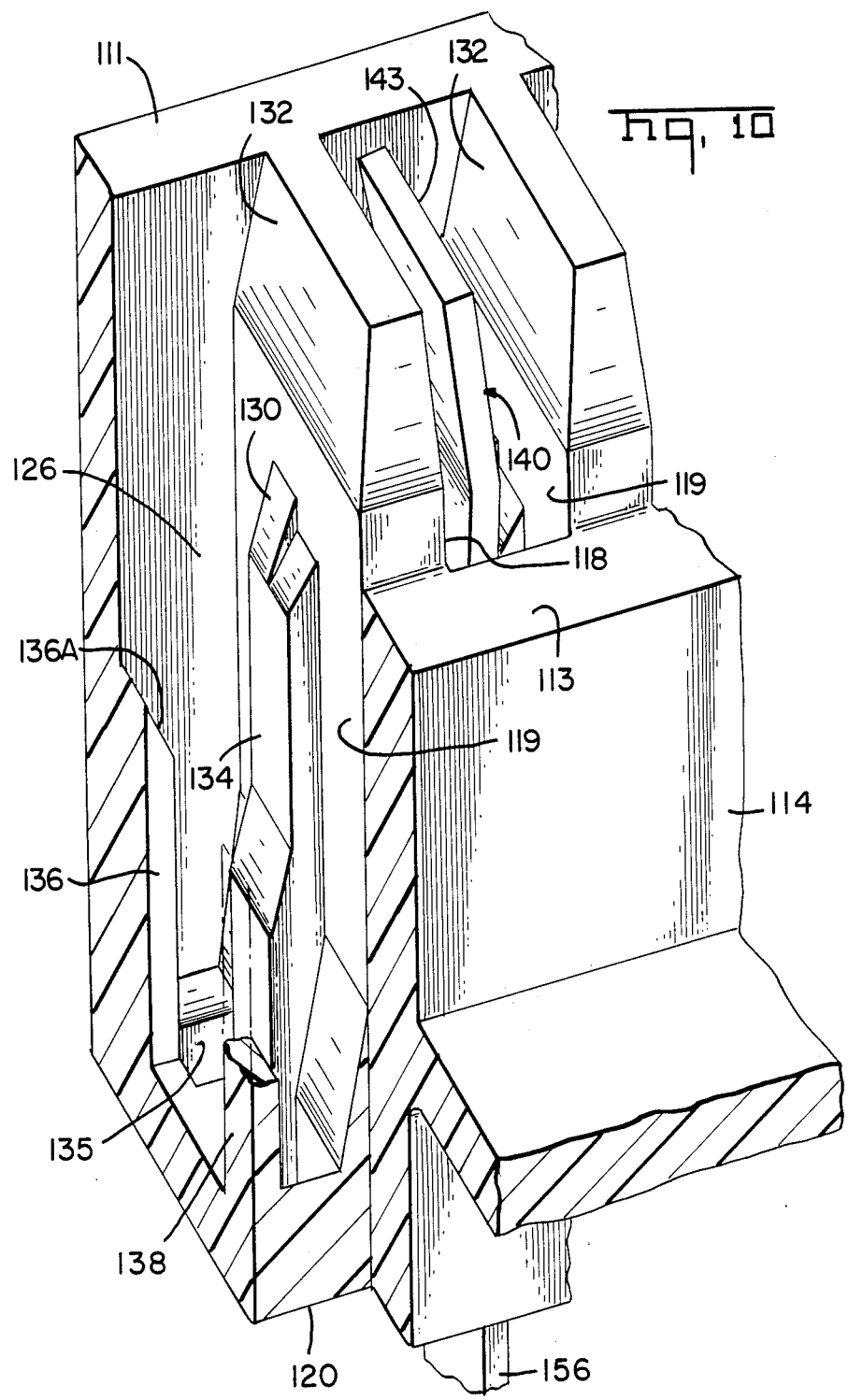

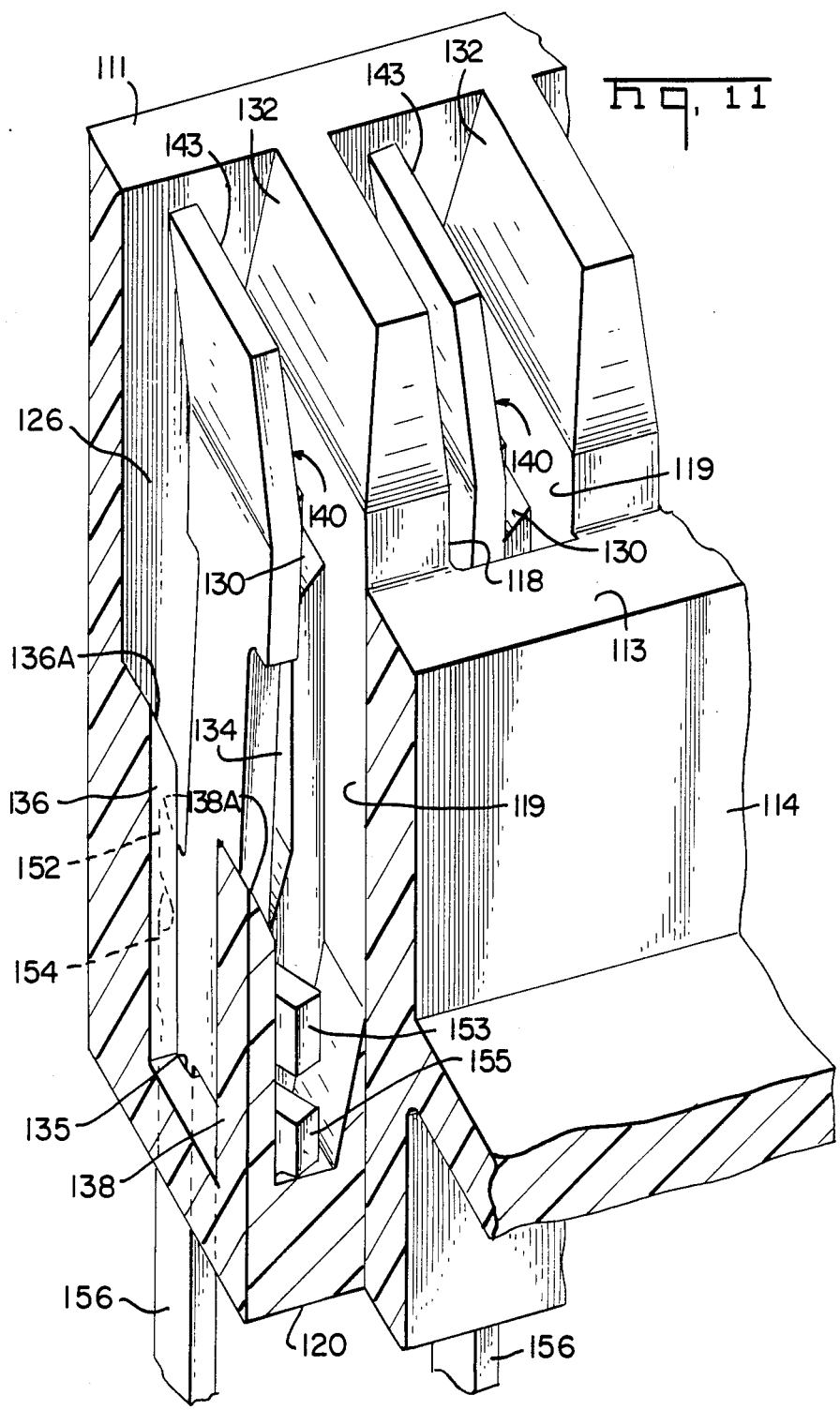

SOCKET FOR INTEGRATED CIRCUIT COMPONENT

This application is a continuation-in-part application of pending application Ser. No. 677,154 filed Dec. 3, 1984, now U.S. Pat. No. 4,560,218 and entitled Socket for Surface Mount DIP.

BACKGROUND OF THE INVENTION

1. Field of the Invention

This application relates to a socket for an integrated circuit component package and more specifically relates to an apparatus which can be used for socketing surface mount packages and to burn-in sockets which can be used with small packages such as a small outline integrated circuit package.

2. Description of the Prior Art

Dual in-line packages, or DIPs, are a standard means for packaging circuit elements such as integrated circuit chips. Each DIP consists of a main plastic body having two rows of leads extending downwardly therefrom for reception in plated-through holes or miniature spring sockets in a printed circuit board (PCB). Conventional DIP packages constitute the most common means for packaging integrated circuit chips. These small integrated circuit chips are bonded to a metal lead frame having a plurality of leads extending from opposite sides and stamped from the thin metal plate defining the lead frame. The chip and the portion of the lead frame surrounding the chip are encapsulated in a plastic body, leaving the stamped leads to extend outwardly from opposite sides of the plastic body. In a conventional DIP, these leads are then bent downwardly to form leads suitable for through-hole mounting in a printed circuit board. In order to reduce the possibility of damaging the leads and further to facilitate replacement of a conventional DIP, sockets suitable for receiving a conventional DIP can be mounted on the printed circuit board, thus permitting repeated insertion and withdrawal of the DIP from the socket. A low profile DIP socket having good contact properties and constant insertion force is disclosed in U.S. Pat. No. 4,060,296.

Some applications require that DIPs be temperature cycled or "burned-in" before use, to reduce the possibility of failure. For this purpose, sockets incorporating housings made from a temperature resistant material and including contacts offering low insertion force for engaging the DIP leads without imposing stress thereon during burn-in have been developed. One such socket is marketed by AMP incorporated as the DIPLOMATE HT (high temperature) socket.

In an effort to reduce the size of printed circuit board assemblies, new integrated circuit component packages such as the small outline integrated circuit have recently come into expanded use. The small outline integrated circuit package (SOIC) also has opposed rows of leads extending outwardly from the sides of an encapsulating plastic body. As the name would indicate, small outline integrated circuit components are significantly smaller than conventional DIPs. The centerline spacing between adjacent leads in an SOIC is significantly smaller than for a DIP. Small outline integrated circuit packages are also intended to be compatible with surface mount printed circuit board components, in which components are attached to pads on the surface of the printed circuit boards rather than having leads extending through holes in the printed circuit boards. Surface mounting technology is seen as offering significant advantages in increasing the density of components mounted on a printed circuit board. The leads on surface mount SOICs are bent downwardly from the sides of the SOIC plastic body, but the leads are also intended for soldering immediately in the vicinity of the lower surface of the plastic body. Thus with conventional SOICs, the leads are bent outwardly to form feet which are suitable for forming a lap joint on a surface mount pad. Other conventional surface mount joints might require different, though conventional, configurations of the leads extending from an SOIC.

Although SOICs are intended for direct, surface mount, attachment to a printed circuit board, the advantages of socketing integrated circuit packages, long perceived with conventional DIPs, would also apply to SOIC packages. For example, in evaluating the integrity of specific components by use of burn-in techniques, sockets from which the SOIC package could be readily removed would be necessary. Conventional burn-in socket configurations are unsuited for use with SOIC packages, in part because of the extremely close spacings of the SOIC leads and because of the fragility of the small leads in an SOIC package. Sockets for standard DIPs having contacts for receiving downwardly projecting leads are also quite unsuitable for engaging laterally projecting feet on conventional SOIC packages. One test socket used with SOICs is shown in U.S. Pat. No. 4,461,525.

SUMMARY OF THE INVENTION

This invention relates to apparatus for socketing an integrated circuit component such as a DIP or a small outline integrated circuit package, in which the integrated circuit component has a plurality of leads, stamped from a lead frame, extending from the sides of the integrated circuit component body. The apparatus includes a socket housing having a plurality of cavities, each oriented to receive a single lead extending from the integrated circuit component. A plurality of terminals, each individually positioned within a single cavity, are oriented to engage the leads. These terminals engage only an interstitial edge of the stamped lead inserted into the respective cavity. By engaging only the edge of the stamped lead, the terminal does not exert significant stresses on the individual lead. Although some stresses normal to the plane of the lead may be exerted during insertion, when the package is fully inserted into the socket housing, only loads or stresses in the plane of the leads are applied by the resilient terminals. Thus significant damage to the lead component body interface is avoided, preventing deterioration of the component over time, and preserving coplanarity of the leads. In this configuration, the individual terminals extend between adjacent leads, rather than extending in the same plane as the individual leads. Thus considerable savings and space can be achieved, making this configuration especially adaptable for use with small outline integrated circuit components.

The terminals employ resilient contact surfaces for engaging the interstitial edges of the leads. In one embodiment of this invention, the contact terminals are bowed intermediate the ends to form a leaf spring which resiliently engages the lead in lateral compression against an endwall in the housing cavity. In another embodiment, the initially flat contacts are bowed during insertion into the housing cavities for contact retention purposes and the lead contact portion of the terminal is deflected to engage an opposite endwall of the cavity to preload the terminal. Insertion of a lead into the cavity moves the contact spring abreast of the opposite sidewall thus maintaining a laterally compressive force in the plane of the lead.

BRIEF DESCRIPTION OF THE DRAWINGS

FIG. 1 is a cut-away perspective of a first embodiment of the socket with a contact exploded therefrom.

FIG. 2 is a top view of the first embodiment of the socket.

FIG. 3 is an end view of the first embodiment of the socket, taken along lines 3—3 of FIG. 2, with a package poised for insertion.

FIG. 4 is a cut-away side view of the first embodiment of the socket with the package poised for insertion.

FIG. 4A is a partial cut-away side view of the first embodiment of the socket with a package in place.

FIG. 7 is a transverse sectional view of the second embodiment of the socket as shown in FIG. 5 showing insertion and preloading the terminals.

FIG. 8 is a view similar to FIG. 7 but showing the integrated circuit component inserted within the housing to deflect the terminals.

FIG. 10 is a cutaway perspective view showing the housing configuration of the first embodiment.

FIG. 11 is a view similar to FIG. 10 showing the terminal positioned within a cavity.

DETAILED DESCRIPTION OF THE PREFERRED EMBODIMENTS

Figure 5:
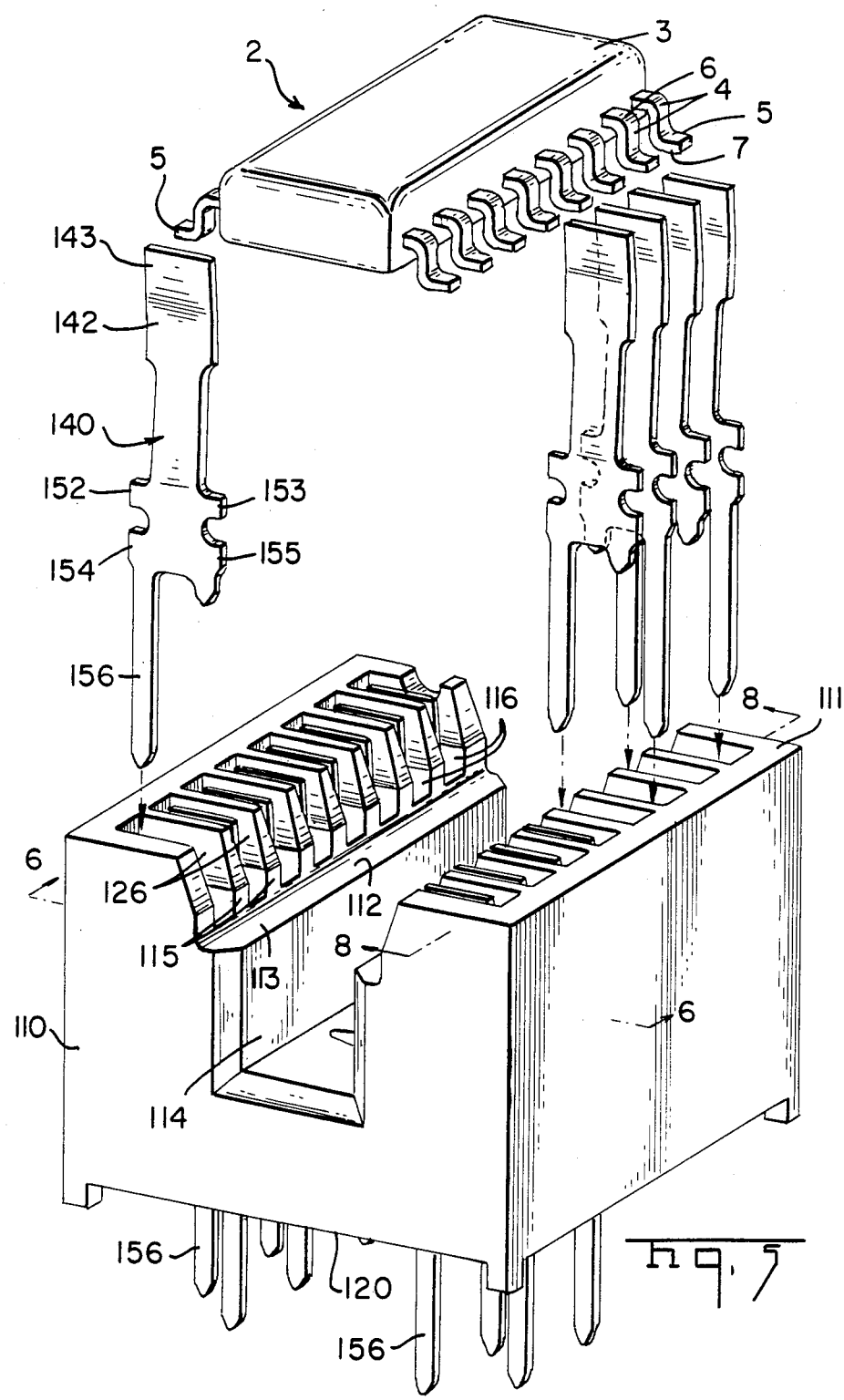
FIG. 5 is an exploded perspective of a second embodiment of the socket with some of the contacts exploded therefrom.
Figure 6:
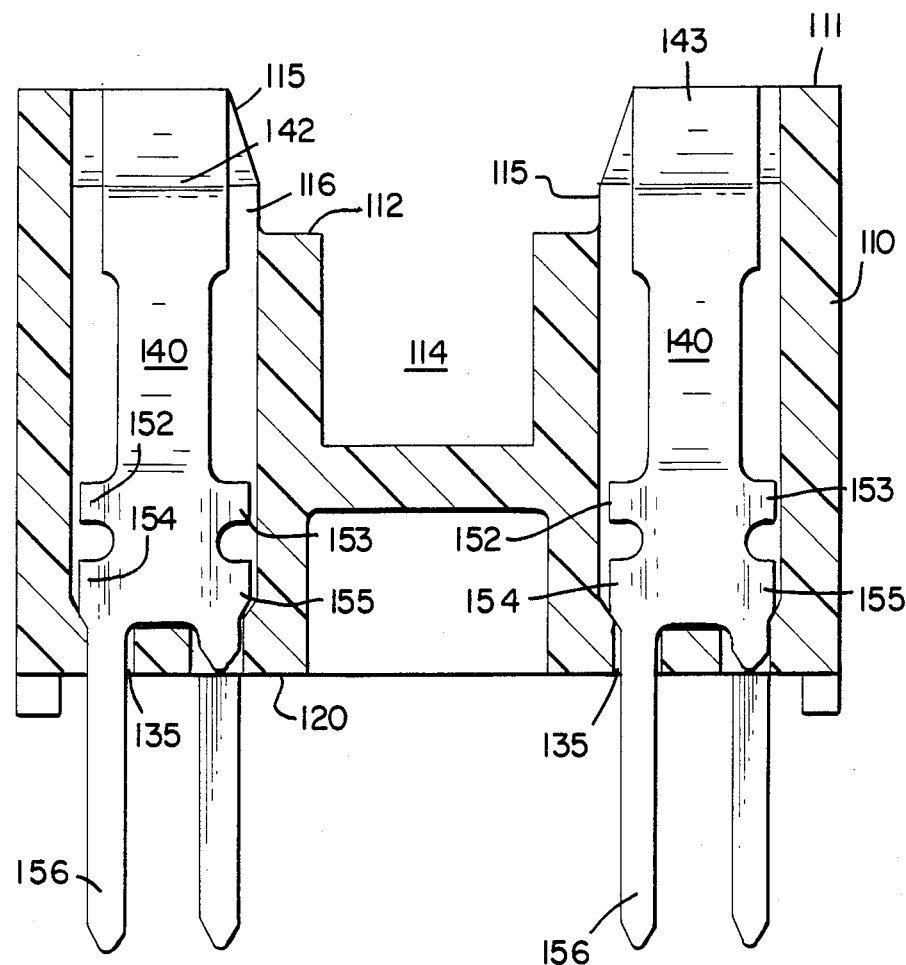
FIG. 6 is a sectional view of the second embodiment of the socket shown in FIG. 5 in which the terminals are shown positioned within the housing.

Referring to FIG. 1, the first embodiment of the socket of the present invention is shown mounted on a printed circuit board 8 with a SOIC package 2 exploded therefrom. The package 2 comprises a plastic body 3 in which an integrated circuit chip or other element is encapsulated, the body 3 having two rows of external leads 4 extending from opposite sides. The leads 4 in each row are spaced about 0.050 inches between centers and are formed with laterally extending feet 5 suitable for soldering to pads for direct surface mounting. Each lead 4 is stamped and formed from sheet metal and has roll surfaces 6 and sheared surfaces or interstitial edges 7. These sheared or interstitial edges are formed when the lead frame is stamped to define the leads. Note that lead frames may also be etched from sheet stock so that it should be understood that the term sheared surfaces, sheared edges, or interstitial edges is used herein to refer to either stamped or etched edges. Furthermore, it should be understood that the term interstitial edges refers not only to the edges between adjacent contacts but also to the edges on the outer leads in any one row.

A socket in accordance with this invention is suitable for use with an SOIC package having leads on a centerline spacing of 0.050 inches. A socket of this type can interconnect an SOIC having sixteen leads with the length of the socket being less than 0.450 inches and the width being less than 0.400 inches.

The socket of the first embodiment has a dielectric housing 10, which may be molded of a temperature resistant plastic such as polyphenylene sulfide. This socket also has two rows of contacts 40 stamped and formed from metal sheet stock such as beryllium copper. Each housing 10 has a package receiving face 11, an opposed mounting face 20, and two parallel rows of contact receiving apertures or cavities 26 extending therebetween. Face 11 has a package receiving nest or seat 12 defined by parallel opposed sidewalls 15 and a floor 13 having a sword slot 14 which facilitates removal of the package 2. The seat or nest 12 serves to support the package upon insertion therein. Each cavity 26 has an endwall 28 against which the contact is seated. A contact 40 is shown spaced outward therefrom for clarity. Supports 24 at the four corners of face 20 position the housing 10 against printed circuit board 8. The housing forms a plurality of interstitial partitions forming endwalls 18 and 19 within the cavities. These interstitial partitions extend between adjacent cavities.

Still referring to FIG. 1, each contact 40 has a first end 41, a second end 42 and a leaf spring 43 formed therebetween. Each contact 40 has opposed sheared edges 50, 54 formed with shoulders 52, 55 respectively. The shoulders 55 engage the shoulder 35 in the housing to prevent the end 41 from abutting the end of the endwall 28, which would impede flexure of the leaf spring. Second end 42 is formed as a foot or lateral extension 56 for soldering against surface pad 9 on printed circuit board 8. The feet 56 are exposed between the supports 24 to provide access for inspecting solder joints and better cooling during burn-in. Foot 56, profiled by adjacent slot 57, is narrower than the rest of the contact 40 to provide lateral compliance in the plane of the metal. The recess 22 is molded in the housing to enhance cooling and to ensure uniform temperature distribution to prevent cracking during burn-in.

FIG. 2 is a top view of the socket with a part of a package 2 shown inserted. Mating face 11 is interrupted by package receiving seat 12 defined by sidewalls 15 having channels 16 therein having chamfered lead-in 17 and opposed endwalls 18, 19. Only the leaf spring 43 of each contact 40 lying in respective apertures 26 is visible. The springs 43 abut respective endwalls 30 of apertures 26 until deflected by feet 5 during insertion of the package.

FIG. 3 shows a SOIC package 2 poised for insertion in nest 12. The leaf springs 43 are located to engage sheared surfaces 7 of feet 5 when the body 3 contacts floor 13. Each cavity 26 is profiled by parallel opposed sidewalls 32, 34 which are generally parallel to the sidewalls 15 of the nest. A contact 40 is received between sidewalls 32, 34, in an interference fit toward face 20. Wing 51 adjacent leaf spring 43 serves to provide additional contact surface for a foot 5 on a lead 4.

FIG. 4 is a cut-away side view of the socket with package 2 poised for insertion. The leaf spring 43 is formed with a convex surface 45 on one rolled surface 44 of contact 40, facing endwall 30, and a concave surface 49 on the opposed rolled surface 48, facing endwall 28. The apex 46 of convex surface 45 is loaded against endwall 30, which assures that opposed rolled surface 48, towards ends 41, 42, will lie against endwall 28. This positioning is achieved during insertion of the contacts 40 in respective cavities 26. When a foot 5 is received in channel 16, the leaf spring 43 will resile as shown in FIG. 4A to force the foot 5 against the opposed endwall 19 of the channel 16. The sheared surfaces 7 on opposed edges of each foot 5 are thus subjected to compressive forces when the package is in place, while there are no residual stresses on the leads 4 and likewise no residual stresses imposed on the body 3. No stresses are imposed upon the leads normal to the plane of the leads when the socket is fully inserted. The only stresses imposed thereon are during insertion when the package is at ambient temperature and less subject to damage. Note in FIG. 4 that each contact 40 may undergo slight lateral flexure at foot 56 and further may undergo slight axial movement or expansion relative the housing 10. This provides two additional axes of compliance in addition to that already described, assuring that variation and tolerances and expansion rates will not impose undue stresses on the solder joints or elsewhere during burn-in.

The second embodiment of this invention shown in FIGS. 5 through 9 differs from the first embodiment in that the second embodiment is intended for through-hole socketing a SOIC package. The size of this embodiment is on the same order of magnitude as the first embodiment. The second embodiment also employs a preloaded contact terminal 140 which initially comprises a flat blank which is arcuately deformed upon insertion into a socket cavity. The second embodiment of this invention is shown in FIG. 5 in which several contacts 140 are shown exploded from an insulative socket housing 110. Before insertion into a cavity 126, the terminal 140 is flat with the exception of upper lead-in section 143 which is the terminal. These terminals 140 are stamped from flat stock in the same manner as terminals 40. Four laterally extending ears 152, 153, 154, and 155 are positioned intermediate the length of the terminal 140. The leaf spring section 142 is located between the lead-in 143 and the contact retention ears located intermediate the ends of the terminal. A single terminal leg 156, adapted for receipt in a hole in a printed circuit board or other substrate, extends from the lower end of the contact retention section of the terminal. The leg 156 is thus adapted to establish a mechanical and electrical interconnection to both the printed circuit board and to conductive traces located on the printed circuit board substrate.

The terminal receiving cavities 126 are similar to the cavities 26 of the first embodiment of this invention in that each is physically adapted for receipt of leads extending from the opposite side of the integrated circuit component 2. In these preferred embodiments the cavities 26 and 126 are oriented to receive the leads 4 of a small outline integrated circuit component having the laterally projecting feet 5 characterizing this conventional integrated circuit component package. Each cavity or aperture 126 extends from the top surface to the bottom surface of the insulative housing 110. A beveled surface 132 located adjacent the top surface of the housing provides a cavity lead-in. With the terminal 140 in the preloaded position, the lead-in terminal surface 143 is spaced from the beveled cavity lead-in 132 to provide a suitable target for a lead 4. Each cavity has two opposite end surfaces 118 and 119 generally defining the walls of the interstitial partitions 128. A shoulder 130 is defined intermediate the ends of each cavity 126 on end surface 119, with the portion between shoulder 130 and the top surface of the housing cavity 126 being wider than that portion between the shoulder 130 and the lower surface of the housing. Ribs 134, 136 and 138 are defined along endwall surfaces 118 and 119 between shoulder 130 and the lower surface of the housing. The rib 134 is centrally disposed within the housing along wall surface 119. As seen in FIG. 10, the centrally disposed rib 134 does not extend entirely across the rectangular cavity 126. The two end ribs 136 and 138 are located along surface 118 and extend outwardly from surface 118 towards surface 119. The height of ribs 136 and 138 is greater than the height of the centrally disposed rib 134. Edge ribs 136 and 138 each have inclined surfaces 136A and 138A respectively located at the top of the rib. Finally, each cavity communicates with the lower surface of the housing through apertures 135.

Figure 9A:
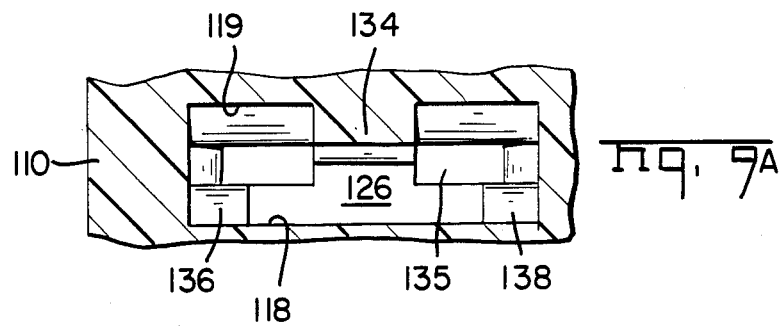
FIGS. 9 A-D are a series of views showing the insertion and preloading of the terminal of the second embodiment of this invention.
Figure 9B:
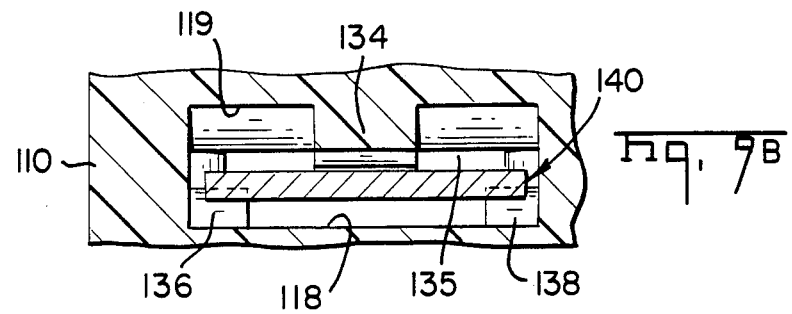
Figure 9C:
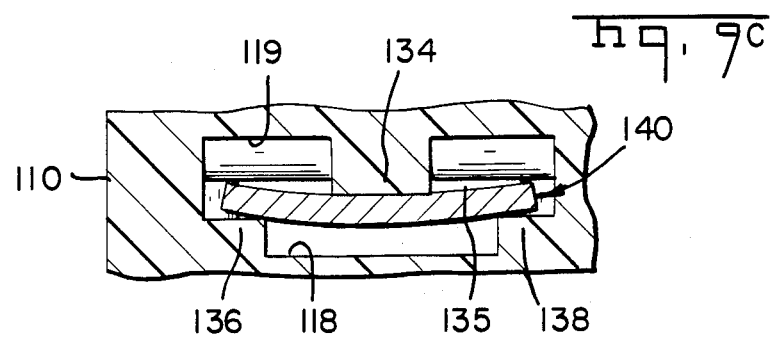
Figure 9D:
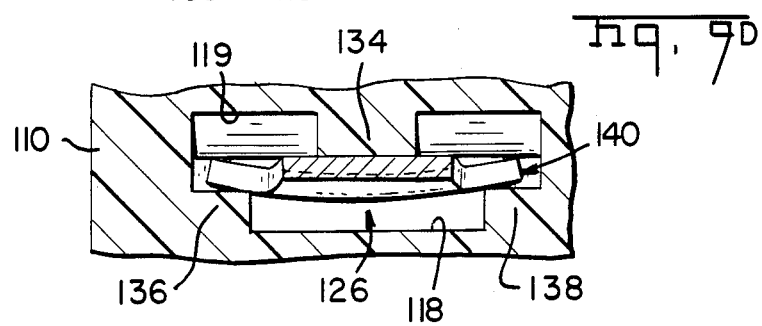

The resilient terminals 140 are inserted into the housing cavities 126 from the top side of the housing as shown in FIG. 7. Prior to insertion, the terminals 140 are substantially flat, with the exception of the lead-in section 143. As the terminals are inserted into cavities 126, the legs 156 initially enter the cavity. The width of legs 156 is less than the spacing between the centrally disposed rib 134 and the edge of the housing, thus permitting legs 156 to extend therebetween. The thickness of the contact material forming the terminal 140 is greater than the unobstructed path between these ribs. As the ears 152, 153, 154, 155 engage the inclined surfaces 136A and 136B, the contacts are cupped or arcuately deformed around the centrally disposed rib 134 as shown in FIG. 9D and FIG. 11. Thus the contacts are frictionally held within the cavities. Since the height of rib 134 is less than the height of the two edge ribs 136 and 138, the edge ribs will be in contact with the convex portion of the deflected or arcuately deformed contact terminal 140 above the area at which the rib 134 engages the terminal. Thus the terminal will be deflected away from the surface 118 toward the opposite surface 119. Indeed the terminal will engage the opposite surface 119 in the vicinity of the shoulder 130 and be flexed to preload the terminal prior to insertion of the SOIC package. In this preloaded configuration the terminal will be abreast the wall 119. FIG. 8 shows the position of the terminals when the integrated circuit components are fully inserted into cavities 126. Since the cavities 126 have inwardly open cavity portions along the inwardly oriented face above the ledge 113 defining the component supporting seat 112, the leads can be received by the housing. As the SOIC package leads move downwardly through the component lead receiving opening defined by the contact lead-in 143 and the housing beveled surface 132, the contact terminals 140 and the resilient leaf spring portions 143 engage the interstitial edges of the individual leads 4, little if any force normal to the plane of the leads is exerted against the leads. The leaf spring portions defining relatively flat or planar lead engaging portions or contact surfaces are deflected away from wall 119 to a position abreast the surface 118 as the SOIC package is inserted. With the SOIC package fully inserted and resting against the seat, as shown in FIG. 8, even less normal stress is applied to the leads 4. Indeed, substantially no normal force is applied.

In addition to reducing the undesirable stresses which would be placed on the SOIC leads, especially the shoulders of the leads, positioning the terminals 140 abreast of the two walls 118 and 119 also permits the flat portions of the terminals to extend between adjacent leads 4 in the socket. Thus the spacing between terminals is not dependent upon the width of each individual terminal, thus enabling the socket to have centerline spacings corresponding with those of small outline integrated circuit components. Furthermore, the legs 156 on adjacent terminals can be staggered such that appropriate spacing can be achieved for the through-hole interconnection of the legs 156 to conductive traces on the printed circuit board substrate.

The socket 110 is especially suited for rapid and easy insertion and removal of SOIC packages, thus permitting increased throughput. The SOIC Package is positioned on seat 112 when the leads are fully inserted. A sword slot 114 extends along the entire length of the socket providing clearance for automated handling of the SOIC package during insertion and removal.

Although the preferred embodiments of this invention are specifically adapted for use with small outline integrated circuit components, it should be understood that sockets made in accordance with the principles disclosed herein could be employed for other integrated circuit components such as conventional DIPs. Engagement of the contact terminals with the interstitial edges of the DIP leads would provide similar advantages. Therefore the invention disclosed herein is not limited to the specific configurations and embodiments shown herein.

What is claimed is:

1. Apparatus for socketing integrated circuit components, in which the integrated circuit components each have a plurality of component leads extending in rows on opposite sides of an integrated circuit component body, the apparatus comprising:

an insulative socket housing having a plurality of cavities extending inwardly from the top thereof, the cavities being arranged along and adjacent opposite outer sides of the housing, and having centerline spacings equivalent to the centerline spacings of the component leads, each cavity being open along the top of the housing and partially open along an inwardly oriented face of the housing, the housing defining a component seating ledge at the bottom of the inwardly open portions of the cavities, each cavity having first and second opposite endwalls extending from said inwardly oriented face toward the outer housing side; and a plurality of resilient contact terminals received within corresponding cavities, each terminal having an arcuately deformed intermediate section restrained within the corresponding cavity and a component lead contact surface preloaded toward the first endwall, the terminals being oriented to engage a corresponding lead insertable between the terminal and the first endwall only along one interstitial edge of the lead; the opposite interstitial edge of each leading engaging the first endwall.

2. The apparatus of claim 1 wherein the terminals exert a force only against the interstitial edges of the component leads when the integrated circuit component body is positioned on the component seating ledge.

3. The apparatus of claim 2 wherein the arcuately deformed intermediate terminal section comprises means for stiffening the terminals upon engagement with the component leads.

4. The apparatus of claim 3 wherein the intermediate terminal section initially comprises a flat section, the flat section being arcuately deformed upon insertion into a cavity.

5. The apparatus of claim 1 wherein each terminal includes a leg extending through an orifice on the bottom surface of the housing.

6. The apparatus of claim 5 wherein the legs of adjacent terminals are laterally staggered.

7. The apparatus of claim 6 wherein the legs comprise means for interconnecting the terminals to conductive traces on a substrate, the stagger of the legs increasing the spacing between adjacent interconnections to the conductive traces.

8. The apparatus of claim 1 wherein a plurality of ribs are defined on the first and second endwalls, the ribs engaging the respective terminal along laterally disposed portions of each terminal, a portion of the terminal being arcuately deformed upon engagement with the ribs.

9. The apparatus of claim 8 wherein the ribs comprise a centrally disposed rib extending from the second endwall and at least one rib extending adjacent an edge of the first endwall.

10. The apparatus of claim 9 wherein two ribs extend adjacent opposite edges of the first endwall, the centrally disposed rib, extending from the second endwall, the two ribs adjacent the opposite edges of the first endwall extending closer to the component lead receiving opening to flex the terminal closer toward the second endwall.

11. The apparatus of claim 1 wherein a shoulder is defined on the second endwall between the component lead receiving opening and the contact retention portion, each terminal being preloaded into contact with the shoulder, the lead in portion of the terminal being positioned between the shoulder and the top of the socket.

12. Apparatus for socketing small outline integrated circuit components, in which the small outline integrated circuit components each have a plurality of leads, stamped from a lead frame, partially encapsulated within an integrated circuit component body, the leads extending transversely outwardly from opposite sides of an integrated circuit component body, adjacent leads being spaced apart on centerlines no greater than 0.05 inch, each component lead being formed downwardly and extending to but not substantially beyond a lower surface of the body; the apparatus comprising: a socket housing having a plurality of cavities, each cavity comprising means for receipt of individual small outline integrated circuit component leads and being defined by interstitial partitions, endwalls of each cavity comprising end surfaces of interstitial partitions; and a plurality of resilient terminals, individually positioned within each cavity, each terminal having a planar lead contact portion, the planar lead contact portions being oriented to extend both perpendicular to the individual leads and between adjacent leads to resiliently engage each lead along only one interstitial edge, the opposite interstitial edge of each lead engaging an endwall of the cavity.

13. The apparatus of claim 12 wherein the planar lead contact portions are oriented within respective cavities to engage only an interstitial edge of a stamped lead insertable into the corresponding cavity.

14. The apparatus of claim 13 wherein each planar lead contact portion is located abreast a first cavity endwall extending perpendicular to the individual leads, with a lead positioned within a cavity.

15. The apparatus of claim 14 wherein each planar lead contact portion is preloaded toward a second cavity endwall prior to insertion of a component lead therein and flexes to a position abreast the opposite first cavity endwall with the component lead in the cavity.

16. The apparatus of claim 12 wherein the planar lead contact portion is oriented to engage an interstitial edge of a lead in the corresponding cavity without applying stresses normal to the plane of the lead.

17. The apparatus of claim 12 wherein the cavities are located in two rows on opposite sides of the housing, each cavity having an inwardly open side extending above an intermediate seat surface comprising means for supporting the small outline integrated circuit component.

18. A socket for an integrated circuit package of the type having two opposed rows of leads formed with laterally projecting feet for mounting against surface contacts on a printed circuit board, the socket comprising a dielectric housing a package receiving face and an opposed board mounting face with two parallel rows of apertures extending therebetween, the package receiving face having therein a package receiving nest having a floor flanked by parallel opposed sidewalls, the sidewalls of the nest having respective parallel rows of channels therein, each aperture having a pair of opposed sidewalls paralleling the sidewalls of the nest and a pair of opposed endwalls substantially perpendicular thereto, the apertures in each row intersecting respective channels, a row of the channels being spaced to receive said feet when said package is placed in the nest, a plurality of elongate formed contacts lying in respective apertures, each contact having first and second sheared surfaces facing respective sidewalls of the aperture and opposed first and second rolled surfaces facing respective endwalls thereof, each contact having a first end proximate said package receiving face and an opposed second end proximate the mounting face, each contact forming a leaf spring facing one said endwall, the apex of the leaf spring being located so that the leaf springs resiliently engage the feet of the package leads in the channels when the package is inserted in the nest.

19. The socket of claim 18 wherein the nest comprises a seat defined by two parallel spaced apart ledges having a sword slot extending therebetween.

20. Apparatus for socketing integrated circuit components, in which the integrated circuit components have a plurality of component leads extending in rows on opposite sides of an integrated circuit component body, the apparatus comprising:

an insulative socket housing having a plurality of cavities extending inwardly from the top thereof, the cavities being arranged along and adjacent opposite outer sides of the housing, and having centerline spacings equivalent to the centerline spacings of the component leads, each cavity being open along the top of the housing, each cavity having opposite endwalls, each cavity being partially open along an inwardly oriented face of the housing, the opposite endwalls defining each cavity extending from said inwardly oriented face toward an adjacent outer housing side; and a plurality of resilient contact terminals received within corresponding cavities, each terminal having only a single component lead contact surface preloaded toward one of said endwalls, the single component lead contact surface being oriented to engage a corresponding lead insertable between the terminal and the one endwall only along one interstitial edge of the lead, the opposite interstitial edge of the lead engaging the one endwall.

21. The apparatus of claim 20 wherein each terminal has an arcuately deformed intermediate section restrained within the corresponding cavity.

22. Apparatus for socketing an integrated circuit component, in which the integrated circuit component has a plurality of leads, stamped from a lead frame, extending from the sides of an integrated circuit component body, the apparatus comprising: a socket housing having a plurality of cavities defined by opposed endwalls and oriented for receipt of individual leads; and a plurality of terminals individually positioned within each cavity, each terminal having a substantially flat contact surface, the cavity endwalls engaging each terminal to spring bias each terminal normal to the planar contact surface, each terminal being oriented within respective cavities to engage a stamped lead insertable into the cavity along only one interstitial edge of the lead, the opposite interstitial edge of each lead engaging one of said endwalls of the cavity.

23. The apparatus of claim 22 wherein the socket housing comprises a one-piece member, each terminal engaging the housing for retaining each terminal in the respective cavity.

* * * * *